(12) United States Patent
Mertol et al.

(10) Patent No.: US 6,818,996 B2
(45) Date of Patent: Nov. 16, 2004

(54) MULTI-LEVEL REDISTRIBUTION LAYER TRACES FOR REDUCING CURRENT CROWDING IN FLIPCHIP SOLDER BUMPS

(75) Inventors: Atila Mertol, Cupertino, CA (US); Senol Pekin, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 157 days.

(21) Appl. No.: 10/327,333

(22) Filed: Dec. 20, 2002

(65) Prior Publication Data

US 2004/0121522 A1 Jun. 24, 2004

(51) Int. Cl.$^7$ .................. H01L 23/48; H01L 23/52; H01L 29/40; H01L 21/44
(52) U.S. Cl. ................ 257/773; 257/767; 438/612; 438/597
(58) Field of Search ................ 257/767, 773; 438/597, 612

(56) References Cited

U.S. PATENT DOCUMENTS

| | | | |
|---|---|---|---|
| 3,239,719 A | 3/1966 | Shower | |
| 3,517,278 A | 6/1970 | Hager | |
| 4,603,345 A | 7/1986 | Lee et al. | |
| 4,654,692 A | * 3/1987 | Sakurai et al. | ............ 257/775 |
| 4,825,284 A | 4/1989 | Soga et al. | |
| 4,893,172 A | 1/1990 | Matsumoto | |
| 5,239,448 A | 8/1993 | Perkins | |
| 5,289,036 A | * 2/1994 | Nishimoto | ............ 257/774 |
| 5,382,831 A | * 1/1995 | Atakov et al. | ............ 257/767 |
| 5,461,260 A | * 10/1995 | Varker et al. | ............ 257/773 |
| 5,689,139 A | * 11/1997 | Bui et al. | ............ 257/758 |
| 5,847,936 A | 12/1998 | Forehand | |
| 5,969,421 A | 10/1999 | Smooha | |
| 6,169,326 B1 | * 1/2001 | Jun | ............ 257/734 |
| 6,417,572 B1 | * 7/2002 | Chidambarrao et al. | .... 257/773 |
| 6,522,021 B2 | * 2/2003 | Sakihama et al. | ......... 257/784 |

* cited by examiner

*Primary Examiner*—David A. Zarneke
(74) *Attorney, Agent, or Firm*—Fitch, Even, Tabin & Flannery

(57) ABSTRACT

A multi-level redistribution layer trace reduces current crowding in solder bumps of an integrated circuit package. A multi-level redistribution layer trace for an integrated circuit die includes a redistribution layer trace formed on the integrated circuit die in each of a plurality of electrically conductive layers and an I/O pad formed at a termination of the redistribution layer trace so that the I/O pad extends through each of the plurality of electrically conductive layers to form an electrical junction between the termination of the redistribution layer trace and the I/O pad in each of the plurality of electrically conductive layers. The redistribution layer trace may also be slotted to divide current flow horizontally at the electrical junction between the termination of the redistribution layer trace and the I/O pad in each of the plurality of electrically conductive layers.

18 Claims, 7 Drawing Sheets

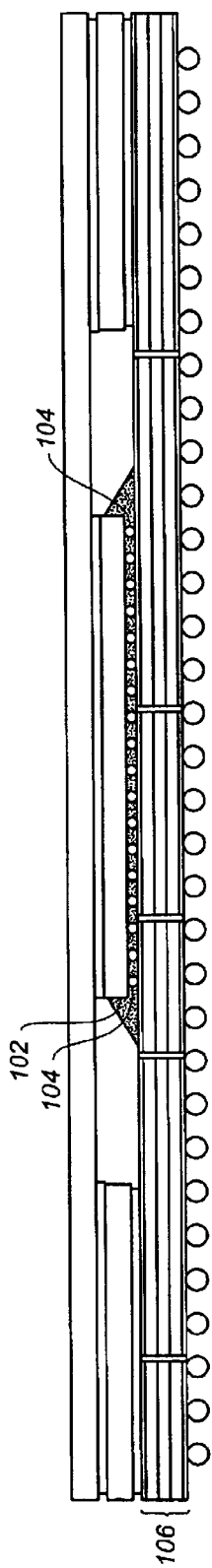
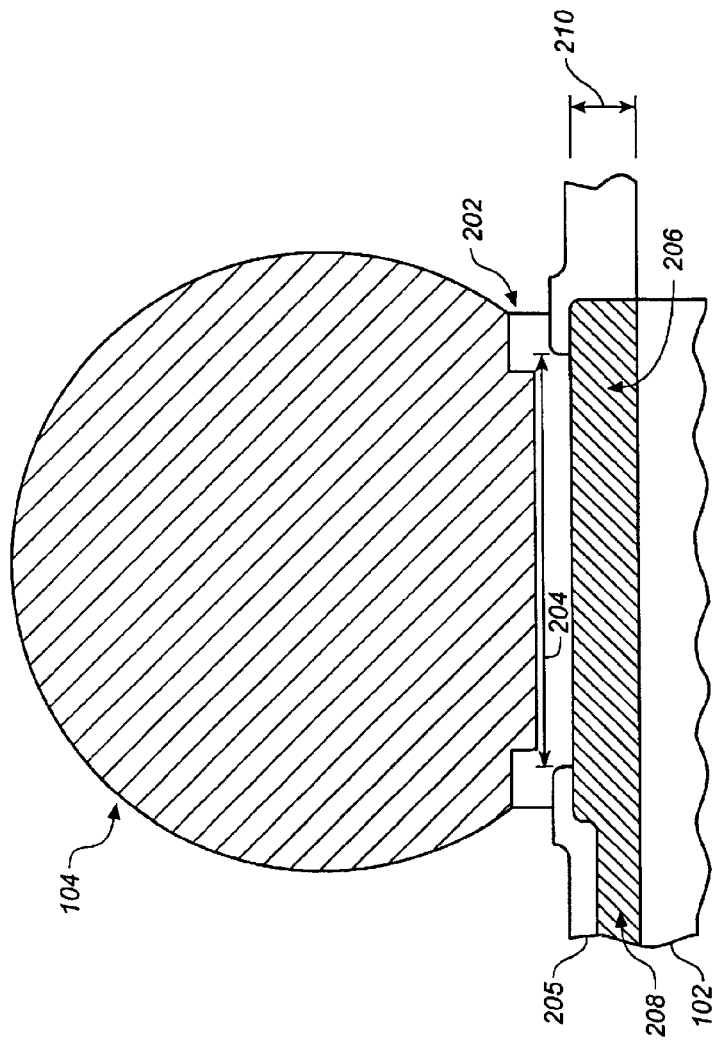
FIG._1
FIG._2

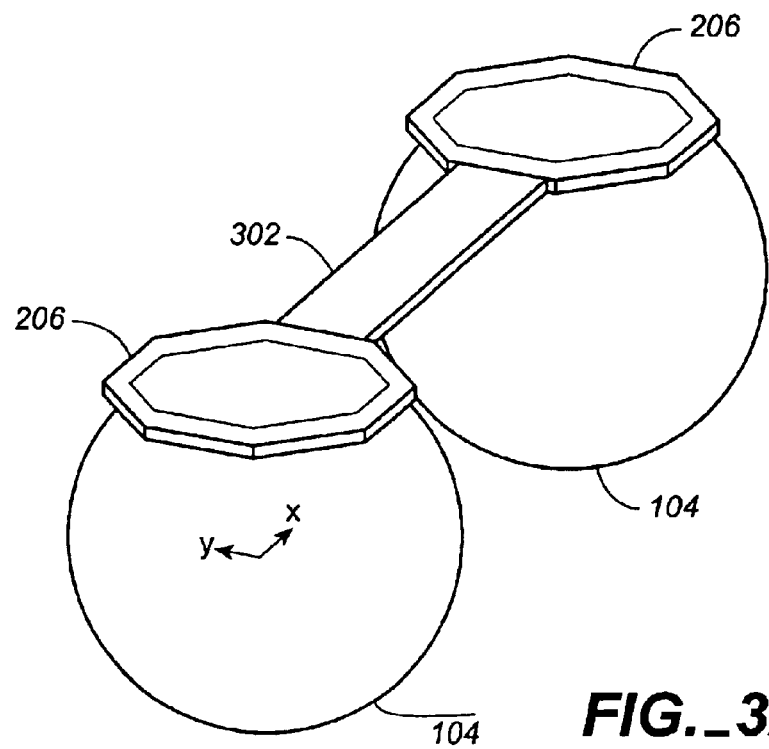
FIG._3A
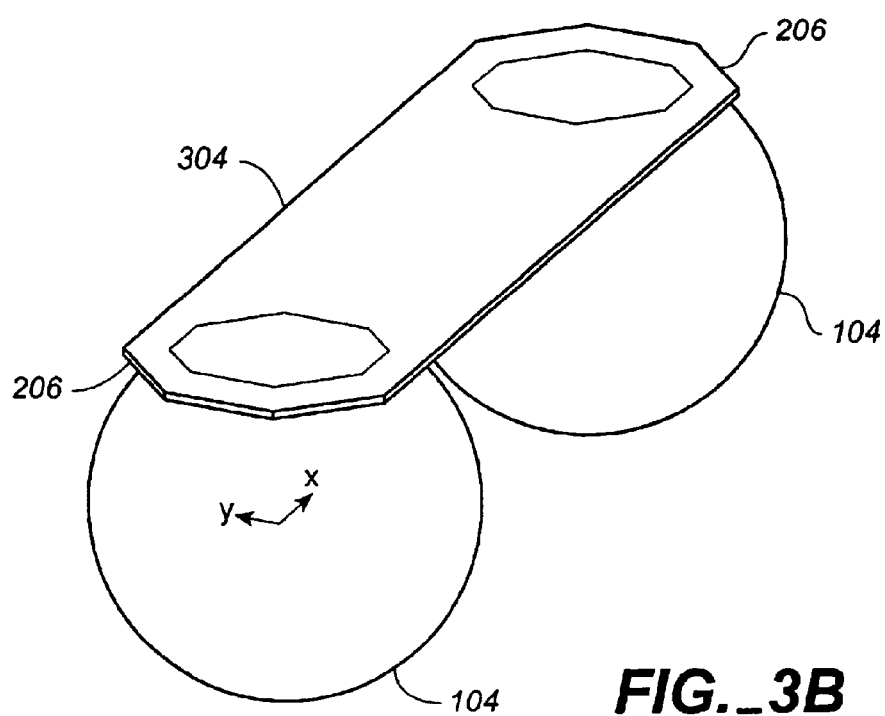
FIG._3B

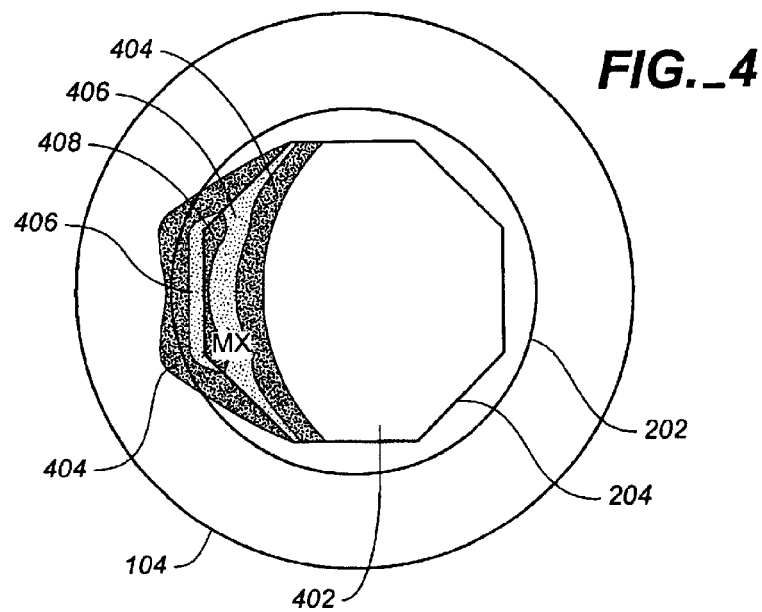
FIG._4
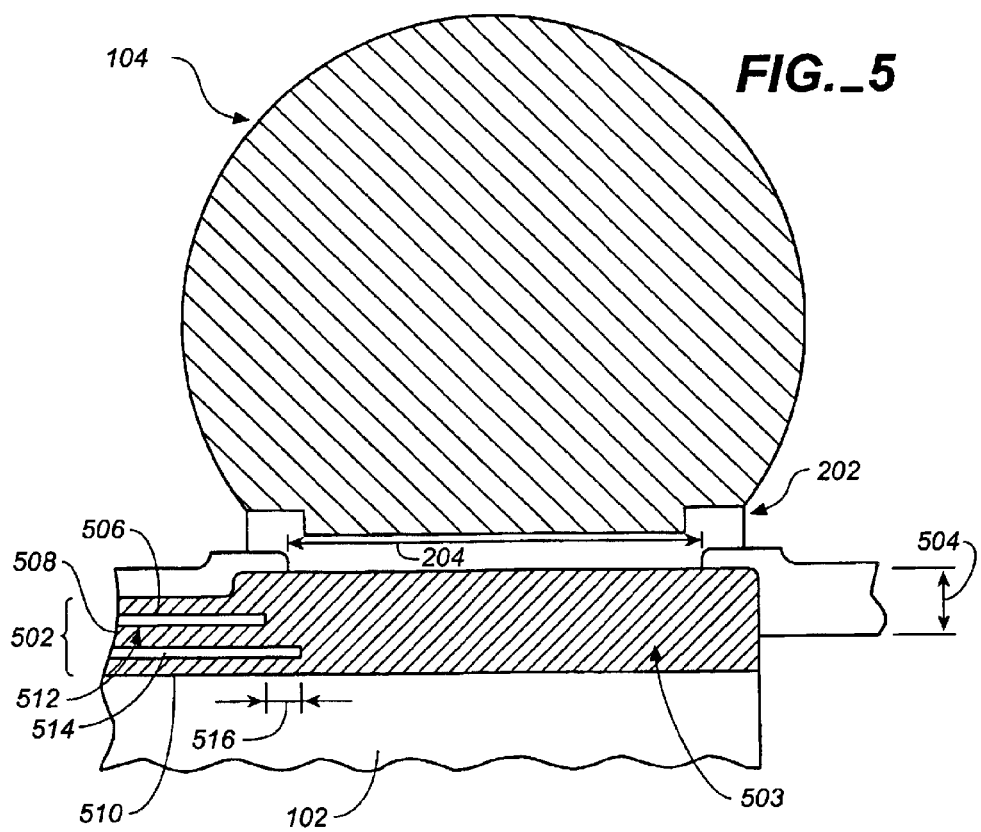
FIG._5

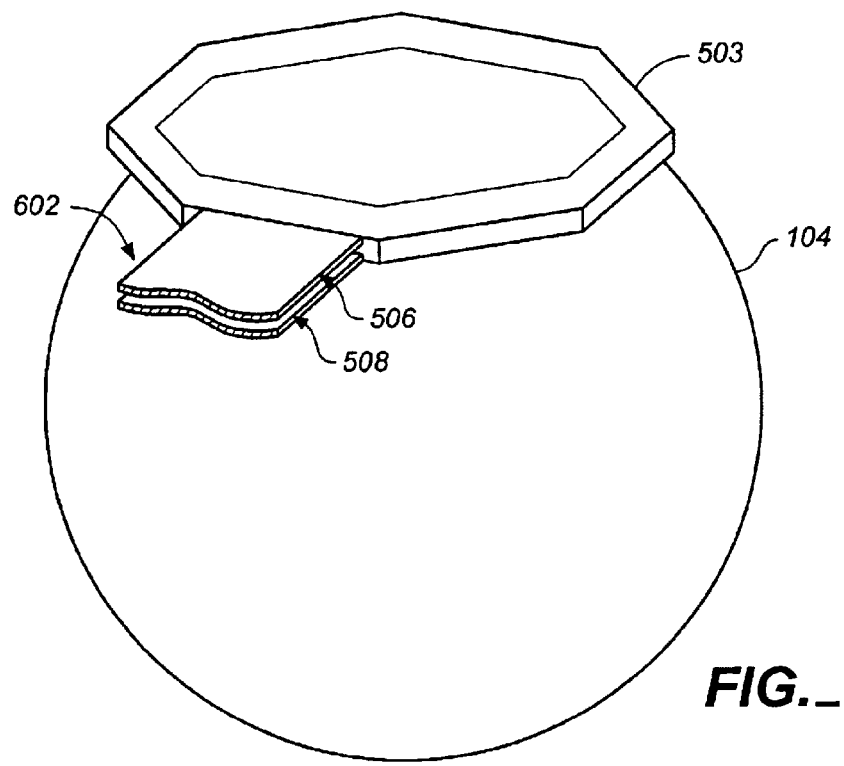
*FIG._6*
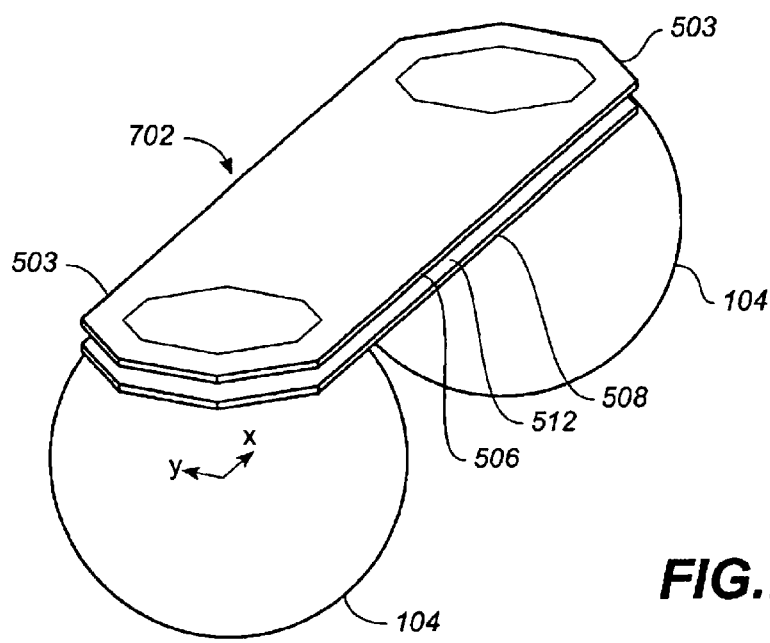
*FIG._7*

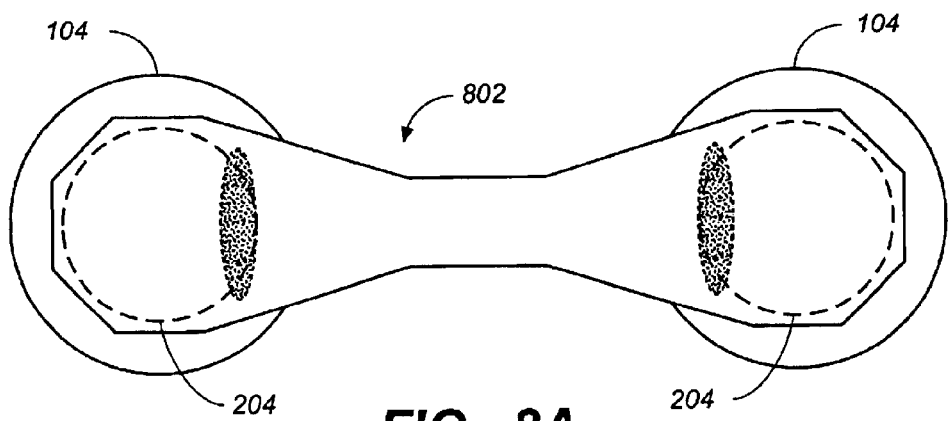
FIG._8A
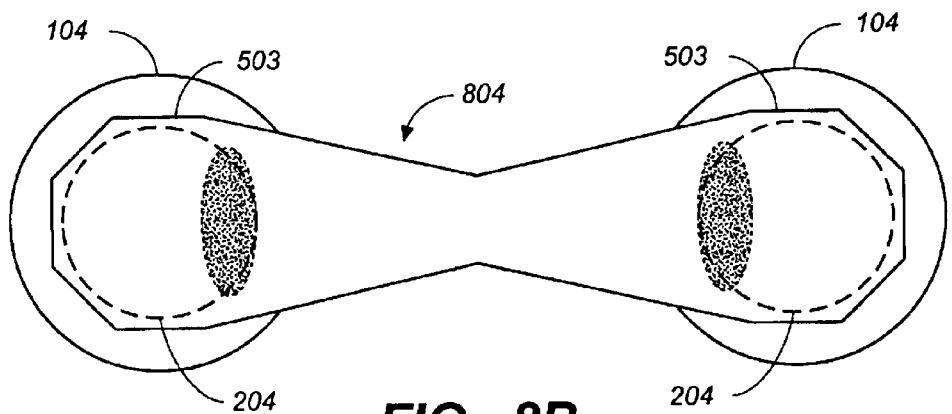
FIG._8B
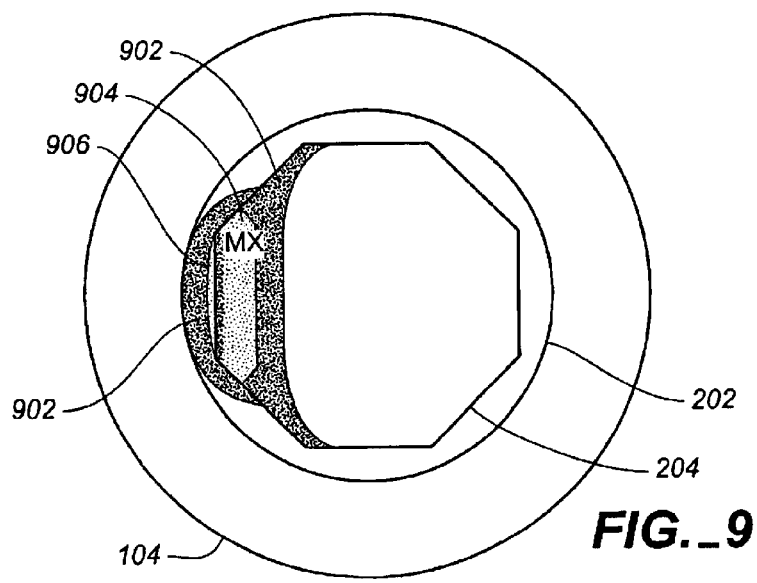
FIG._9

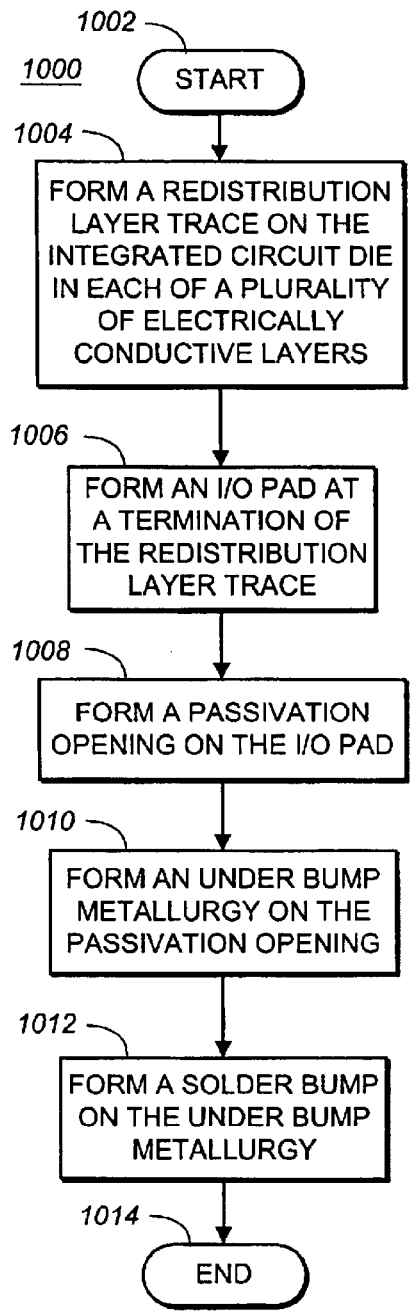
FIG._10
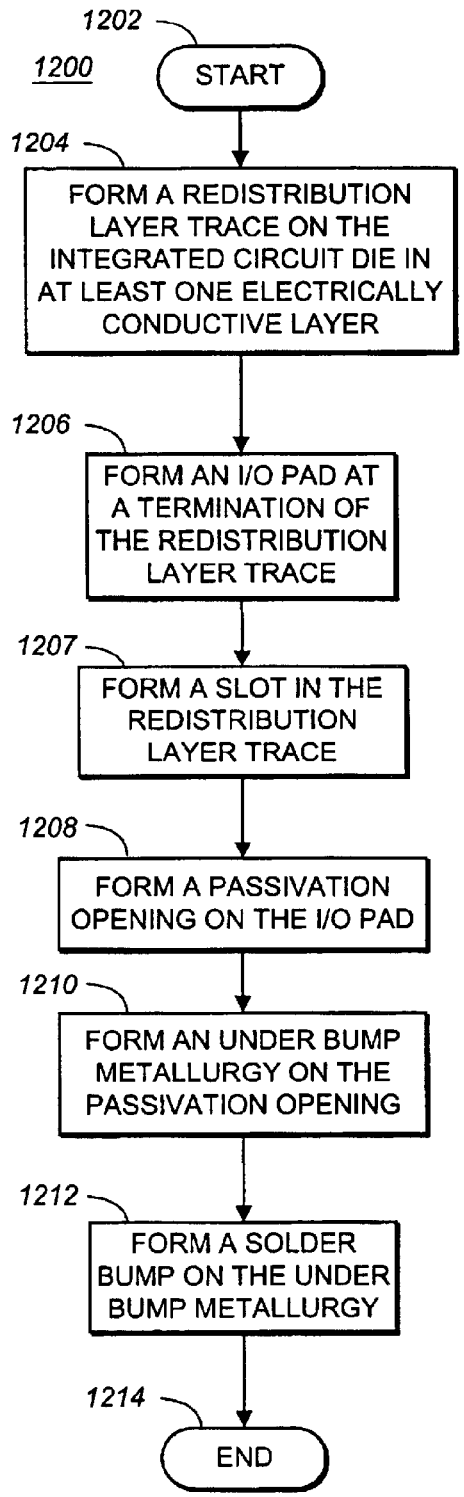
FIG._12

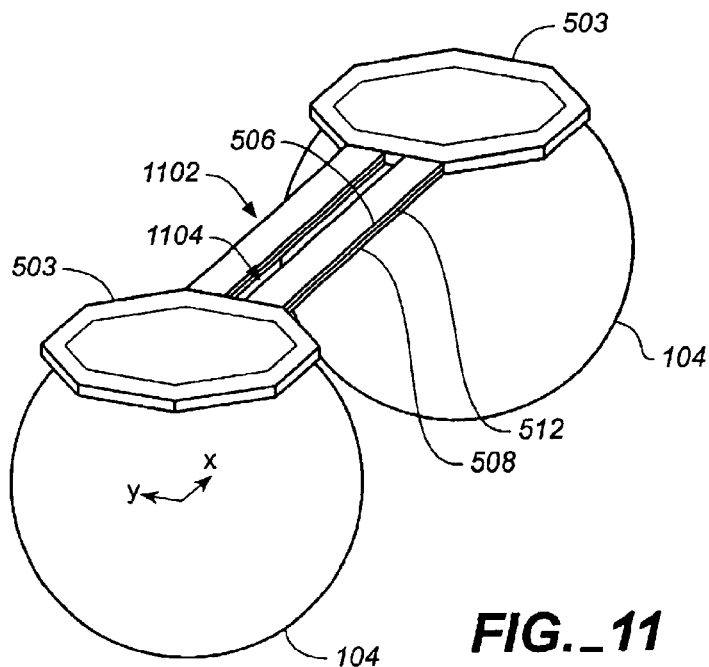
FIG._11
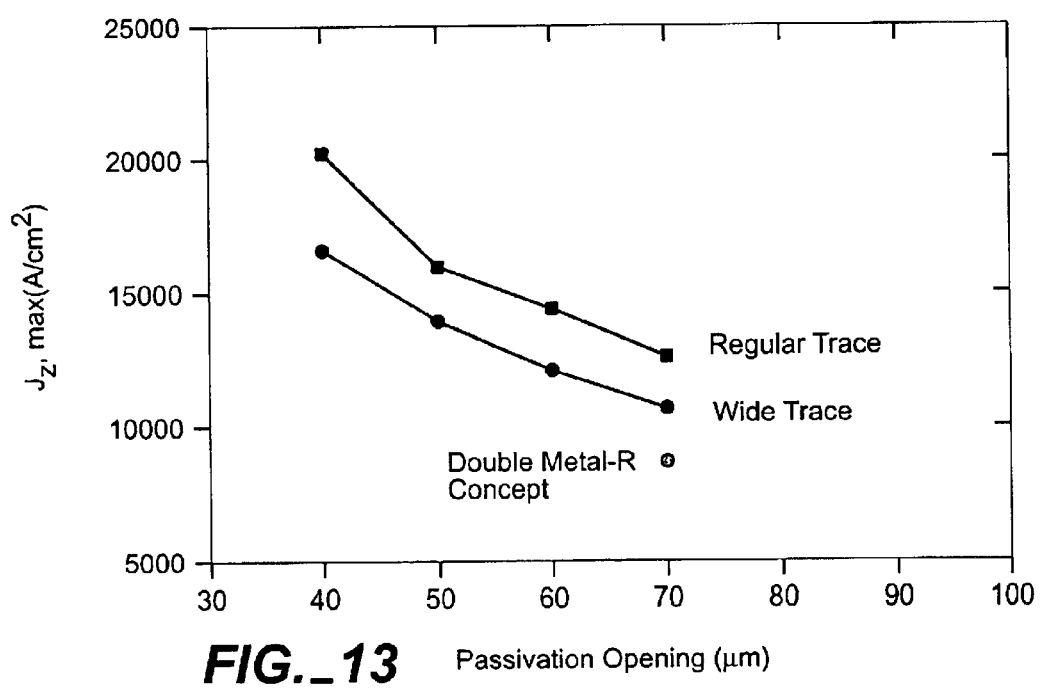
FIG._13  Passivation Opening (μm)

MULTI-LEVEL REDISTRIBUTION LAYER TRACES FOR REDUCING CURRENT CROWDING IN FLIPCHIP SOLDER BUMPS

CROSS-REFERENCE TO RELATED APPLICATIONS

This application is related to U.S. patent application Ser. No. 10/010,485 by Senol Pekin et al. for "TAPERED DIE INTERCONNECT FOR ELECTROMIGRATION RESISTANT FLIP CHIP PACKAGE", filed on Dec. 5, 2001, incorporated herein by reference and assigned to the same assignee as the present invention.

BACKGROUND OF THE INVENTION

1. Field of the Invention

The present invention relates generally to the design of flip-chip packages used in the manufacture of integrated circuits. More specifically, but without limitation thereto, the present invention relates to metal redistribution layer traces in an integrated circuit die.

2. Description of the Prior Art

An important issue in microelectronic packaging is reliability. Technologies for microelectronic packaging are developed not only to manufacture microelectronic packages at low cost, but also to ensure that the performance of the microelectronic packages will not deteriorate over their service life. A critical factor in determining the service life of an integrated circuit is the redistribution of current through the metal redistribution layer of the integrated circuit die. The metal redistribution layer is a conductive layer formed on a surface of the die in which traces are formed that connect various signals and power between the die and I/O pads formed on the surface of the die. The I/O pads connect the signals between the traces and the package substrate through solder bumps. In certain areas of the solder bumps near the junctions of the traces and the I/O pads, the current density reaches a maximum that may shorten the useful life of the integrated circuit. The peaking of the current density at the junctions of the traces and the I/O pads and in the solder bumps is generally referred to as current crowding. It has been discovered that current crowding results in the deterioration of not only the trace junctions, which decreases the wafer level reliability, but also the solder bumps, which decreases the package level reliability.

SUMMARY OF THE INVENTION

In one aspect of the present invention, a multi-level redistribution layer trace reduces current crowding in solder bumps of an integrated circuit package. In one embodiment, a multi-level redistribution layer trace for an integrated circuit die includes a redistribution layer trace formed on the integrated circuit die in each of a plurality of electrically conductive layers and an I/O pad formed at a termination of the redistribution layer trace so that the I/O pad extends through each of the plurality of electrically conductive layers to form an electrical junction between the termination of the redistribution layer trace and the I/O pad in each of the plurality of electrically conductive layers.

In another aspect of the present invention, a method of making a multi-level redistribution layer trace of an integrated circuit die includes the steps of forming a redistribution layer trace on the integrated circuit die in each of a plurality of electrically conductive layers, and forming an I/O pad at a termination of the redistribution layer trace so that the I/O pad extends through each of the plurality of electrically conductive layers to form an electrical junction between the termination of the redistribution layer trace and the I/O pad in each of the plurality of electrically conductive layers.

In a further aspect of the present invention, a multi-level redistribution layer trace of an integrated circuit die includes a redistribution layer trace formed on the integrated circuit die in one or more electrically conductive layers, and a slot formed in the redistribution layer trace to divide the current flow horizontally at an electrical junction between a termination of the redistribution layer trace and an I/O pad.

In yet another aspect of the present invention, a method of making a multi-level redistribution layer trace of an integrated circuit die includes the steps of forming a redistribution layer trace on the integrated circuit die in one or more electrically conductive layers, and forming a slot in the redistribution layer trace to divide the current flow horizontally at an electrical junction between a termination of the redistribution layer trace and an I/O pad.

DESCRIPTION OF THE SEVERAL VIEWS OF THE DRAWINGS

The present invention is illustrated by way of example and not limitation in the accompanying figures, in which like references indicate similar elements throughout the several views of the drawings, and in which:

FIG. 1 illustrates a cross-sectional view of a conventional flip chip package of the prior art;

FIG. 2 illustrates a cross-sectional view of a conventional redistribution layer trace in the flipchip package of FIG. 1;

FIG. 3A illustrates a finite element model of a conventional narrow redistribution layer trace corresponding to FIG. 2;

FIG. 3B illustrates a finite element model of a conventional wide redistribution layer trace corresponding to FIG. 2;

FIG. 4 illustrates a computer simulation of current crowding in a solder bump resulting from the conventional redistribution layer trace of FIG. 3A;

FIG. 5 illustrates a cross-sectional view of a multi-level redistribution layer trace according to an embodiment of the present invention;

FIG. 6 illustrates a finite element model of a narrow multi-level redistribution layer trace corresponding to FIG. 5;

FIG. 7 illustrates a finite element model of a wide multi-level redistribution layer trace corresponding to FIG. 5;

FIGS. 8A and 8B illustrate a top view of two tapered multi-level redistribution layer traces corresponding to FIG. 5;

FIG. 9 illustrates a computer simulation of current crowding in a solder bump resulting from the redistribution layer trace of FIG. 6;

FIG. 10 illustrates a flow chart of a method of making a multi-level redistribution layer trace of an integrated circuit die according to an embodiment of the present invention;

FIG. 11 illustrates a finite element model of a slotted multi-level redistribution layer trace according to an embodiment of the present invention;

FIG. 12 illustrates a flow chart of a method of making a slotted redistribution layer trace of an integrated circuit die according to an embodiment of the present invention; and FIG. 13 illustrates a plot of maximum current density vs. passivation opening diameter in a solder bump resulting from the conventional narrow trace of FIG. 3A, the conventional wide redistribution layer trace of FIG. 3B, and the multi-level redistribution layer trace of FIG. 6.

Elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION OF THE ILLUSTRATED EMBODIMENTS

One of the limiting factors of the service life of a microelectronic package is electromigration. Electromigration is the mass transport of atoms in die interconnects and solder bumps of a microelectronic package. Since the invention of the first integrated circuits in the 1960's, electromigration has been a major problem. As package size and I/O pad dimensions decrease with higher density technologies, reliability may be comprised if measures are not taken to mitigate electromigration. Also, with the implementation of a metal redistribution layer made of copper instead of aluminum, the maximum current density capability of the metal redistribution layer doubles from about $4 \times 10^{-3}$ amperes per square micron to about $8 \times 10^{-3}$ amperes per square micron. The higher current density in the metal redistribution layer results in a correspondingly higher current density in the die interconnects and the solder bumps.

Solder bumps are especially prone to failures due to high current crowding in the area near the junctions between the termination of the redistribution layer traces and the I/O pads. Reducing the maximum current density by improving the distribution of current at junctions between the termination of the redistribution layer traces and the I/O pads can significantly increase the reliability of the solder bumps and consequently that of the integrated circuit.

In one aspect of the present invention, a multi-level redistribution layer trace reduces current crowding in solder bumps of an integrated circuit package. In one embodiment, a multi-level redistribution layer trace for an integrated circuit die includes a redistribution layer trace formed on the integrated circuit die in each of a plurality of electrically conductive layers and an I/O pad formed at a termination of the redistribution layer trace so that the I/O pad extends through each of the plurality of electrically conductive layers to form an electrical junction between the termination of the redistribution layer trace and the I/O pad in each of the plurality of electrically conductive layers.

FIG. 1 illustrates a cross-sectional view of a conventional flipchip package of the prior art. Shown in FIG. 1 are a die 102, first level interconnects 104, and a package substrate 106.

In FIG. 1, the first level interconnects 104 are solder bumps formed between the die 102 and the package substrate 106.

FIG. 2 illustrates a cross-sectional view of a conventional redistribution layer trace in the flipchip package of FIG. 1. Shown in FIG. 2 are a die 102, a solder bump 104, under bump metallurgy (UMB) 202, a passivation opening 204, an I/O pad 206, a redistribution layer trace 208, and an I/O pad height 210.

In FIG. 2, the solder bump 104 is electrically connected to the I/O pad 206 by the under bump metallurgy (UMB) 202. The I/O pad 206 is formed on the metal redistribution (metal-R) layer of the die 102 at the termination of the redistribution layer trace 208. The metal redistribution layer is an electrically conductive layer formed on the surface of the die 102 that distributes signals and power between the die 102 and the solder bumps 104, and is formed according to well known chemical deposition techniques such as evaporation, sputtering, and screen printing.

The I/O pad 206 and the redistribution layer trace 208 are formed in the metal redistribution layer by removing selected portions of the metal redistribution layer according to well known photolithography techniques. The I/O pad height 210 extends to the bottom of the redistribution layer trace 208, forming an electrical junction between the termination of the redistribution layer trace 208 and the I/O pad 206 in the metal redistribution layer.

The passivation opening 204 is an opening formed by removing an area around the edge of the I/O pad 206 in a passivation layer formed on the die 102 that protects the metal redistribution layer from contaminants. The passivation opening 204 exposes the I/O pad 206 so that the under bump metallurgy 202 may be formed on the I/O pad 206. The solder bump 104 is then formed on the I/O pad 206 according to well-known techniques.

The under bump metallurgy 202 is formed on the I/O pad 206 through the passivation opening 204 typically has three layers (not shown): an upper layer for promoting adhesion to the solder bump 104, a middle layer for limiting diffusion between the solder bump 104 and the I/O pad 206, and a lower layer for bonding the under bump metallurgy 202 to the I/O pad 206. By way of example, the upper layer may be made of copper, the middle layer may be made of nickel, and the lower layer may be made of the same metal as the I/O pad 206, for example, aluminum or copper.

The solder bump 104 may be formed on the under bump metallurgy 202, for example, by a solder reflow process according to well-known techniques.

FIG. 3A illustrates a finite element model of a conventional narrow redistribution layer trace corresponding to FIG. 2. Shown in FIG. 3A are solder bumps 104, I/O pads 206, and a conventional narrow redistribution layer trace 302.

FIG. 3B illustrates a finite element model of a wide conventional redistribution layer trace corresponding to FIG. 2. Shown in FIG. 3B are solder bumps 104, I/O pads 206, and a conventional wide redistribution layer trace 304.

FIG. 4 illustrates a computer simulation of current crowding in a solder bump resulting from the conventional redistribution layer trace of FIG. 3A. Shown in FIG. 4 are a solder bump 104, an under bump metallurgy 202, a passivation opening 204, a low current crowding area 402, medium current crowding areas 404, and high current crowding areas 406.

In FIG. 4, the current density is low as illustrated by the low current crowding area 402 except on the side of the solder bump 104 near the electrical junction of the I/O pad 206 and the termination of the redistribution layer trace 302 in FIG. 3. The current density increases near the electrical junction of the I/O pad 206 and the termination of the redistribution layer trace 302 as illustrated by the medium current crowding areas 404, and reaches a maximum along the junction of the passivation opening and the under bump metallurgy 202 as illustrated by the high current crowding areas 406. In this example, the maximum value of the current density is $1.07 \times 10^{-4}$ amperes per square micron (millionth of a meter).

FIG. 5 illustrates a cross-sectional view of a narrow multi-level redistribution layer trace according to an embodiment of the present invention. Shown in FIG. 5 are a die 102, a solder bump 104, under bump metallurgy 202, a passivation opening 204, a redistribution layer trace 502, an I/O pad 503, an I/O pad height 504, electrically conductive layers 506, 508 and 510, insulating layers 512 and 514, and a termination offset 516.

The description of FIG. 2 generally applies to FIG. 5, except that multiple electrically conductive layers 506, 508 and 510 are formed on the die 102 to distribute signals and power between the die 102 and the solder bumps 104 instead of the single metal redistribution layer shown in FIG. 2. The electrically conductive layers 506, 508 and 510 may be formed according to the same well-known techniques used to form the single metal redistribution layer shown in FIG. 2. Each of the electrically conductive layers 506, 508 and 510 is electrically insulated from one another, for example, by the insulating layers 512 and 514. The insulating layers 512 and 514 may be formed, for example, by depositing a layer of silicon oxide or silicon nitride on each of the electrically conductive layers 508 and 510. In this example, three electrically conductive layers 506, 508 and 510 are formed on the die 102 and insulated from one another by the insulating layers 512 and 514, however, any number of electrically conductive layers and insulating layers may be formed in the same manner to practice various embodiments of the present invention to suit specific applications. For example, only two electrically conductive layers insulated from each other by a single insulating layer may be formed in the same manner described above to practice the present invention to suit specific applications.

The redistribution layer trace 502 may be formed in each of the electrically conductive layers 506, 508 and 510 according to well-known photolithography techniques. The redistribution layer trace 502 is terminated by the I/O pad 503.

The I/O pad height 504 extends through each of the electrically conductive layers 506, 508 and 510 to form an electrical junction between the I/O pad 503 and the termination of the redistribution layer trace 502 in each of the electrically conductive layers 506, 508 and 510.

An important feature of the present invention is that the I/O pad 503 extends completely through all the electrically conductive layers 506, 508 and 510 so that an electrical junction is formed between the redistribution layer trace 502 and the I/O pad 503 in each of the electrically conductive layers 506, 508 and 510 on the die 102 without any intervening devices such as vias. Previous methods for reducing current crowding such as disclosed by Smooha in U.S. Pat. No. 5,969,421, incorporated herein by reference, incorporate intervening vias between the contact pads and conductive layers in the package substrate.

Current flowing through the redistribution layer trace 502 between the die 102 and the solder bump 104 is divided among each of the electrically conductive layers 506, 508 and 510 so that current flows between the I/O pad 503 and the die 102 through each of the junctions formed between the I/O pad 503 and the termination of the redistribution layer trace 502 in each of electrically conductive layers 506, 508 and 510. Dividing the current among the multiple junctions of the I/O pad 503 with the redistribution layer trace 502 diffuses the current flow between the die 102 and the solder bump 104 over a wider area through the under bump metallurgy 202, substantially reducing the maximum current density as well as the area of high current density in the solder bump 104.

The current flow between the die 102 and the solder bump 104 may be further diffused by terminating the redistribution layer trace 502 at the I/O pad 503 in each of the electrically conductive layers 506, 508 and 510 so that the termination of the redistribution layer trace 502 in one electrically conductive layer is vertically offset from the termination of the redistribution layer trace 502 in a preceding electrically conductive layer as indicated in FIG. 5 by the termination offset 516. The termination offset 516 may have a value ranging from zero to the diameter of the I/O pad 503 in accordance with various embodiments of the present invention to suit specific applications.

FIG. 6 illustrates a finite element model of a narrow multi-level redistribution layer trace corresponding to FIG. 5. Shown in FIG. 6 are a solder bump 104, an I/O pad 503, a redistribution layer trace 602, and electrically conductive layers 506 and 508. In this example, the redistribution layer trace 502 is formed in two electrically conductive layers 506 and 508 that terminate respectively at the top and bottom of the I/O pad 503, and the redistribution layer trace 502 has a width equal to one side of the octagonally shaped I/O pad 503. The shape of the I/O pad 503 is not a limiting factor of the present invention, however, and other geometrical shapes may be used for the I/O pad 503 in various embodiments to practice the present invention to suit specific applications.

FIG. 7 illustrates a finite element model of a wide multi-level redistribution layer trace corresponding to FIG. 5. Shown in FIG. 7 are a solder bump 104, an I/O pad 503, a redistribution layer trace 702, and electrically conductive layers 506 and 508. In this example, the redistribution layer trace 702 is formed in two electrically conductive layers 506 and 508 that terminate respectively at the top and bottom of the I/O pad 503, and the redistribution layer trace 502 has a width equal to the diameter of the octagonally shaped I/O pad 503.

FIGS. 8A and 8B illustrate a top view of two tapered multi-level redistribution layer traces corresponding to FIG. 5. The tapered trace designs shown in FIG. 8 may be used to practice the present invention in various embodiments to further reduce the maximum current density in the solder bumps 104 to suit specific applications. Shown in FIG. 8 are I/O pads 503, a short tapered multi-level redistribution layer trace 802 and a long tapered multi-level redistribution layer trace 804. Both the fast tapered multi-level redistribution layer trace 802 and the slow tapered multi-level redistribution layer trace 804 include a tapered portion having an initial width substantially equal to the diameter of the I/O pad 503. The tapered portion extends from the termination of the redistribution layer trace at the I/O pad 503 to a termination of the tapered portion. In the fast tapered multi-level redistribution layer trace 802, a straight portion having a width substantially equal to a final width of the tapered portion extends from the termination of the tapered portion. In the slow tapered multi-level redistribution layer trace 804, there is no straight portion, that is, the straight portion has a length of substantially zero.

FIG. 9 illustrates a computer simulation of current crowding in a solder bump resulting from the redistribution layer trace of FIG. 6. Shown in FIG. 9 are a solder bump 104, an under bump metallurgy 202, a passivation opening 204, a low current crowding area 902, medium current crowding areas 904, and a high current crowding area 906.

In FIG. 9, the high current crowding area 906 of the multi-level redistribution layer trace of the present invention is smaller than the high current crowding areas 406 of the conventional redistribution layer trace illustrated in the computer simulation of FIG. 4, and the maximum current density of the multi-level redistribution layer trace is only $0.9 \times 10^{-4}$ amperes per square micron compared to $1.07 \times 10^{-4}$ amperes per square micron for the conventional redistribution layer trace.

In another aspect of the present invention, a method of making a multi-level redistribution layer trace of an integrated circuit die includes the steps of forming a redistribution layer trace on the integrated circuit die in each of a plurality of electrically conductive layers, and forming an I/O pad at a termination of the redistribution layer trace so that the I/O pad extends through each of the plurality of electrically conductive layers to form an electrical junction between the termination of the redistribution layer trace and the I/O pad in each of the plurality of electrically conductive layers.

FIG. 10 illustrates a flow chart 1000 of a method of making a multi-level redistribution layer trace of an integrated circuit die according to an embodiment of the present invention.

Step 1002 is the entry point of the flow chart 1000.

In step 1004, a redistribution layer trace is formed on the integrated circuit die in each of a plurality of electrically conductive layers according to well-known techniques. The redistribution layer trace may have a narrow, wide, or tapered shape as described above to further diffuse the current flow between the under bump metallurgy and the solder bump.

In step 1006, an I/O pad is formed at a termination of the redistribution layer trace. The I/O pad extends through each of the plurality of electrically conductive layers to form an electrical junction between the termination of the redistribution layer trace and the I/O pad in each of the plurality of electrically conductive layers. The termination of the redistribution layer trace at the I/O pad may be offset in each of the plurality of electrically conductive layers to further diffuse the current flow into the solder bump as described above.

In step 1008, a passivation opening is formed on the I/O pad.

In step 1010, an under bump metallurgy is formed on the passivation opening.

In step 1012, a solder bump is formed on the under bump metallurgy.

Step 1014 is the exit point of the flow chart 1000.

In a further aspect of the present invention, a multi-level redistribution layer trace of an integrated circuit die includes a redistribution layer trace formed on the integrated circuit die in one or more electrically conductive layers, and a slot formed in the redistribution layer trace to divide the current flow horizontally at an electrical junction between a termination of the redistribution layer trace and an I/O pad.

FIG. 11 illustrates a finite element model of a slotted redistribution layer trace according to embodiment of the present invention. Shown in FIG. 11 are solder bumps 104, I/O pads 503, a slotted multiple layer redistribution layer trace 1102, electrically conductive layers 506 and 508, and a slot 1104.

The slot 1104 extends from the junction of the redistribution layer trace 1102 and the I/O pad 503 into the redistribution layer trace 1102 and may extend the entire length of the redistribution layer trace 1102 as shown in FIG. 11. Alternatively, the slot 1104 may extend less than the entire length of the redistribution layer trace 1102 to practice the present invention in various embodiments to suit specific applications.

In this example, only one slot 1104 is shown in the redistribution layer trace 1102, however, the redistribution layer trace 1102 may include additional slots formed in the same manner as described above to divide the current flow horizontally at the I/O pad 503 to practice the present invention in various embodiments to suit specific applications.

While only two electrically conductive layers 506 and 508 are used to illustrate this example, a single electrically conductive layer may be used to divide the current flow horizontally at the I/O pad 503 to practice the present invention in various embodiments to suit specific applications. Alternatively, more than two electrically conductive layers may be used to practice the present invention in various embodiments to suit specific applications.

In yet another aspect of the present invention, a method of making a multi-level redistribution layer trace of an integrated circuit die includes the steps of forming a redistribution layer trace on the integrated circuit die in one or more electrically conductive layers, and forming a slot in the redistribution layer trace to divide the current flow horizontally at an electrical junction between a termination of the redistribution layer trace and an I/O pad.

FIG. 12 illustrates a flow chart 1200 of a method of making a slotted redistribution layer trace of an integrated circuit die according to an embodiment of the present invention.

Step 1202 is the entry point of the flow chart 1200.

In step 1204, a redistribution layer trace is formed on the integrated circuit die in at least one electrically conductive layer as described above.

In step 1206, an I/O pad is formed on the integrated circuit die that extends through each electrically conductive layer to form an electrical junction between the redistribution layer trace and the I/O pad in each electrically conductive layer as described above.

In step 1207, a slot is formed in the redistribution layer trace that extends into the redistribution layer trace from the electrical junction between the redistribution layer trace and the I/O pad in each at least one electrically conductive layer.

In step 1208, a passivation opening is formed on the I/O pad.

In step 1210, an under bump metallurgy is formed on the passivation opening.

In step 1212, a solder bump is formed on the under bump metallurgy.

Step 1214 is the exit point of the flow chart 1200.

FIG. 13 illustrates a plot of passivation opening diameter vs. maximum current density for the conventional narrow trace of FIG. 3A, the conventional wide redistribution layer trace of FIG. 3B, and the multi-level redistribution layer trace of FIG. 6. The passivation opening diameter is defined by the width of the intersection of the passivation 204, the I/O pad 206, and the first level interconnect 104 in FIG. 6.

The points plotted in the plot of FIG. 13 correspond to the maximum current density of each corresponding redistribution layer trace design. The conventional narrow redistribution layer trace has the highest maximum current density. The conventional wide redistribution layer has the next highest maximum current density, and the multi-level redistribution layer trace of the present invention has the lowest maximum current density.

Although the methods of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A multi-level redistribution layer trace for an integrated circuit die comprising:

a plurality of redistribution layer traces formed in electrically conductive layers of an integrated circuit die; and an I/O pad extending through each of the electrically conductive layers to form an electrical junction between the termination of each of the plurality of redistribution layer traces and the I/O pad.

2. The multi-level redistribution layer trace of claim 1 wherein each of the electrically conductive layers is electrically insulated from one another.

3. The multi-level redistribution layer trace of claim 1 wherein at least one of the plurality of redistribution layer traces comprises:

a tapered portion having an initial width substantially equal to a diameter of the I/O pad wherein the tapered portion extends from the termination of the redistribution layer trace to a termination of the tapered portion; and a straight portion having a width substantially equal to a final width of the tapered portion that extends from the termination of the tapered portion to a termination of the straight portion.

4. The multi-level redistribution layer trace of claim 3 wherein the straight portion has a substantially zero length.

5. The multi-level redistribution layer trace of claim 1 further comprising a passivation opening formed on the I/O pad.

6. The multi-level redistribution layer trace of claim 5 further comprising an under bump metallurgy formed on the passivation opening.

7. The multi-level redistribution layer trace of claim 6 further comprising a solder bump formed on the under bump metallurgy.

8. The multi-level redistribution layer trace of claim 1 wherein the electrical junction formed between the termination of at least one of the plurality of redistribution layer traces in one of the electrically conductive layers and the I/O pad is vertically offset from the electrical junction between the termination of the redistribution layer trace and the I/O pad in another of the electrically conductive layers.

9. The multi-level redistribution layer trace of claim 1 further comprising a slot formed in at least one of the plurality of redistribution layer traces to divide current flow horizontally at the electrical junction between the termination of the at least one of the plurality of redistribution layer traces and the I/O pad.

10. A method of making multi-level redistribution layer trace of an integrated circuit die comprising steps for:

forming a plurality of redistribution layer traces in each of a plurality of electrically conductive layers of an integrated circuit die; and forming an I/O pad at a termination of the redistribution layer trace wherein the I/O pad extends through each of the electrically conductive layer, to form an electrical junction between the termination of each of the plurality of redistribution layer traces and the I/O pad.

11. The method of claim 10 further comprising a step for electrically insulating each of the electrically conductive layers from one another.

12. The method of claim 10 wherein the step for forming the plurality of redistribution layer traces comprises steps for:

forming a tapered portion having an initial width substantially equal to a diameter of the I/O pad wherein the tapered portion extends from the termination of the redistribution layer trace to a termination of the tapered portion; and forming a straight portion having a width substantially equal to a final width of the tapered portion that extends from the termination of the tapered portion to a termination of the straight portion.

13. The method of claim 12 wherein the straight portion has a substantially zero length.

14. The method of claim 10 further comprising a step for forming a passivation opening on the I/O pad.

15. The method of claim 14 further comprising a step for forming an under bump metallurgy on the passivation opening.

16. The method of claim 15 further comprising a step for forming a solder bump on the under bump metallurgy.

17. The method of claim 10 further comprising a step for vertically offsetting the electrical junction between the termination of at least one of the plurality of the redistribution layer traces and the I/O pad in one of the electrically conductive layers from the electrical junction between the termination of the redistribution layer trace and the I/O pad in another of the electrically conductive layers.

18. The method of claim 10 further comprising a step for forming a slot in at least one of the plurality of redistribution layer traces to divide current flow horizontally at the electrical junction between the termination of the redistribution layer trace and the I/O pad.

* * * * *